US012604767B2

(12) United States Patent
Gu et al.

(10) Patent No.: US 12,604,767 B2
(45) Date of Patent: Apr. 14, 2026

(54) CHIPSET AND METHOD OF MANUFACTURING THE SAME

(71) Applicant: Shanghai Biren Technology Co., Ltd, Shanghai (CN)

(72) Inventors: Shiqun Gu, Shanghai (CN); Zhou Hong, Shanghai (CN); Linglan Zhang, Shanghai (CN); Zheng Tian, Shanghai (CN); Hongying Zhang, Shanghai (CN); Peng Liu, Shanghai (CN)

(73) Assignee: Shanghai Biren Technology Co., Ltd, Shanghai (CN)

( * ) Notice: Subject to any disclaimer, the term of this patent is extended or adjusted under 35 U.S.C. 154(b) by 755 days.

(21) Appl. No.: 17/958,456

(22) Filed: Oct. 3, 2022

(65) Prior Publication Data

US 2023/0130460 A1    Apr. 27, 2023

(30) Foreign Application Priority Data

Oct. 25, 2021    (CN) .......................... 202111243000.0

(51) Int. Cl.
*H01L 25/18* (2023.01)
*H01L 21/48* (2006.01)
(Continued)

(52) U.S. Cl.
CPC ............ *H01L 25/18* (2013.01); *H01L 21/486* (2013.01); *H01L 21/56* (2013.01);
(Continued)

(58) Field of Classification Search
CPC ....... H01L 25/18; H01L 21/486; H01L 21/56; H01L 23/3157; H01L 23/49811; H01L 23/5383; H01L 23/5384; H01L 23/5385; H01L 24/08; H01L 24/16; H01L 24/80; H01L 24/81; H01L 25/50; H01L 24/05; H01L 2224/05624; H01L 2224/05647; H01L 2224/08225; H01L 2224/16227;
(Continued)

(56) References Cited

U.S. PATENT DOCUMENTS

| | | | | |
|---|---|---|---|---|
| 2012/0106117 | A1* | 5/2012 | Sundaram | ............... H01L 25/18 257/772 |
| 2015/0125993 | A1* | 5/2015 | Lee | ................... H01L 23/49827 438/107 |

(Continued)

*Primary Examiner* — Teresa M. Arroyo
(74) *Attorney, Agent, or Firm* — JCIP GLOBAL INC.

(57)    ABSTRACT

The present disclosure provides a chipset and a manufacturing method thereof. The chipset includes a logic chip, an input/output chip, and an interposer. The logic chip includes a plurality of first bonding components disposed in the first device layer. The input/output chip includes a plurality of second bonding components disposed in the second device layer. The interposer includes a plurality of third bonding components disposed in the third device layer. The logic chip is directly bonded to the first portion of the plurality of third bonding components of the interposer in a pad-to-pad manner through the first portion of the plurality of first bonding components, and the input/output chip is directly bonded to the second portion of the plurality of third bonding components of the interposer in a pad-to-pad manner through the plurality of second bonding components.

12 Claims, 14 Drawing Sheets

100

(51) Int. Cl.

| | |
|---|---|
| *H01L 21/56* | (2006.01) |
| *H01L 23/00* | (2006.01) |
| *H01L 23/31* | (2006.01) |
| *H01L 23/498* | (2006.01) |
| *H01L 23/538* | (2006.01) |
| *H01L 25/00* | (2006.01) |
| *H10D 1/68* | (2025.01) |

(52) U.S. Cl.
CPC .... *H01L 23/3157* (2013.01); *H01L 23/49811* (2013.01); *H01L 23/5383* (2013.01); *H01L 23/5384* (2013.01); *H01L 23/5385* (2013.01); *H01L 24/08* (2013.01); *H01L 24/16* (2013.01); *H01L 24/80* (2013.01); *H01L 24/81* (2013.01); *H01L 25/50* (2013.01); *H10D 1/68* (2025.01); *H01L 24/05* (2013.01); *H01L 2224/05624* (2013.01); *H01L 2224/05647* (2013.01); *H01L 2224/08225* (2013.01); *H01L 2224/16227* (2013.01); *H01L 2224/80424* (2013.01); *H01L 2224/80447* (2013.01); *H01L 2224/80895* (2013.01); *H01L 2224/80896* (2013.01); *H01L 2224/81* (2013.01)

(58) Field of Classification Search
CPC . H01L 2224/80424; H01L 2224/80447; H01L 2224/80895; H01L 2224/80896; H01L 2224/81; H01L 24/13; H01L 24/17; H01L 23/3128; H01L 2221/68354; H01L 2225/06524; H01L 21/568; H01L 21/6835; H01L 21/76895; H01L 23/5386; H10D 1/68

See application file for complete search history.

(56) References Cited

U.S. PATENT DOCUMENTS

| | | | | |
|---|---|---|---|---|
| 2018/0098420 | A1* | 4/2018 | Kariyazaki | H05K 1/0243 |
| 2020/0227389 | A1* | 7/2020 | Teig | H01L 25/50 |
| 2021/0057036 | A1* | 2/2021 | Khan | H01L 25/18 |
| 2021/0257275 | A1* | 8/2021 | Park | H01L 25/18 |
| 2021/0375711 | A1* | 12/2021 | Shen | H01L 24/92 |
| 2022/0352082 | A1* | 11/2022 | Yu | H01L 23/5386 |
| 2022/0352123 | A1* | 11/2022 | Chen | H01L 25/0657 |
| 2022/0399321 | A1* | 12/2022 | Gu | H01L 25/50 |

* cited by examiner

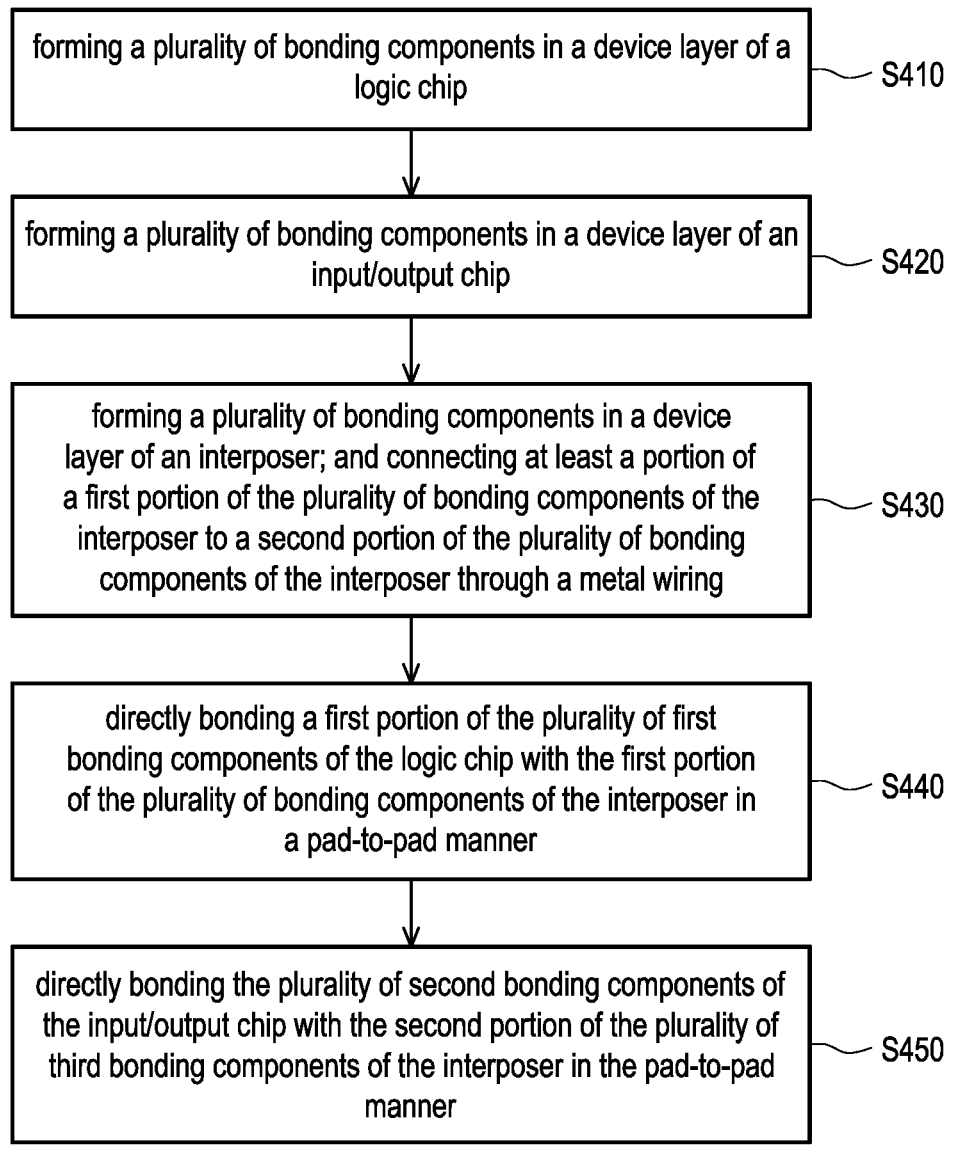

forming a plurality of bonding components in a device layer of a logic chip ~ S410 forming a plurality of bonding components in a device layer of an input/output chip ~ S420 forming a plurality of bonding components in a device layer of an interposer; and connecting at least a portion of a first portion of the plurality of bonding components of the interposer to a second portion of the plurality of bonding components of the interposer through a metal wiring ~ S430 directly bonding a first portion of the plurality of first bonding components of the logic chip with the first portion of the plurality of bonding components of the interposer in a pad-to-pad manner ~ S440 directly bonding the plurality of second bonding components of the input/output chip with the second portion of the plurality of third bonding components of the interposer in the pad-to-pad manner ~ S450

FIG. 4

CHIPSET AND METHOD OF MANUFACTURING THE SAME

CROSS-REFERENCE TO RELATED APPLICATION

This application claims the priority benefit of China application serial no. 202111243000.0, filed on Oct. 25, 2021. The entirety of the above-mentioned patent application is hereby incorporated by reference herein and made a part of this specification.

BACKGROUND

Technical Field

The present disclosure relates to a semiconductor device, in particular to a chipset and a method of manufacturing the same.

Description of Related Art

In terms of a conventional chipset, a connection interface circuit is normally required to be set between a logic chip and an input/output chip in the conventional chipset, such as a die to die (D2D) interface circuit and a high bandwidth memory (HBM) physical interface circuit. Therefore, as the development tendency of current chip design is high-bandwidth and high-density chips, the chip area (or chip volume) of conventional chipsets is often influenced by the increase in the number of these connection interface circuits, and the influence leads to the problem of excessively large chip area and high power consumption.

SUMMARY

According to an embodiment of the present disclosure, the chipset of the present disclosure includes a logic chip, an input/output chip, and an interposer. The logic chip has a first device layer and a first substrate layer, and includes a plurality of first bonding components disposed in the first device layer. The input/output chip has a second device layer and a second substrate layer, and includes a plurality of second bonding components disposed in the second device layer. The interposer has a third device layer and a third substrate layer, and includes a plurality of third bonding components disposed in the third device layer. The logic chip is directly bonded to the first portion of the plurality of third bonding components of the interposer in a pad-to-pad manner through the first portion of the plurality of first bonding components, and the input/output chip is directly bonded to the second portion of the plurality of third bonding components of the interposer in a pad-to-pad manner through the plurality of second bonding components. At least a portion of the first portion of the plurality of third bonding components is connected to at least a portion of the second portion of the plurality of third bonding components through the first metal wiring.

According to an embodiment of the present disclosure, the method for manufacturing a chipset of the present disclosure includes the following steps: forming a plurality of first bonding components on a first device layer of a logic chip; forming a plurality of second bonding components on a second device layer of an input/output chip; forming a plurality of third bonding components on a third device layer of an interposer; connecting at least a portion of the first portion of the plurality of third bonding components to at least a portion of the second portion of the plurality of third bonding components through a first metal wiring; directly bonding the first portion of the plurality of first bonding components of the logic chip with the first portion of the plurality of third bonding components of the interposer in a pad-to-pad manner; and directly bonding the plurality of second bonding components of the input/output chip with the second portion of the plurality of third bonding components of the interposer in a pad-to-pad manner.

Based on the above, the chipset and the manufacturing method thereof of the present disclosure may effectively reduce power consumption and reduce the chip area.

In order to make the above-mentioned features and advantages of the present disclosure more comprehensible, the following embodiments are given and described in detail with the accompanying drawings as follows.

BRIEF DESCRIPTION OF THE DRAWINGS

FIG. 4 is a flowchart of a method for manufacturing a chipset according to an embodiment of the present disclosure.

DESCRIPTION OF THE EMBODIMENTS

Figure 1:
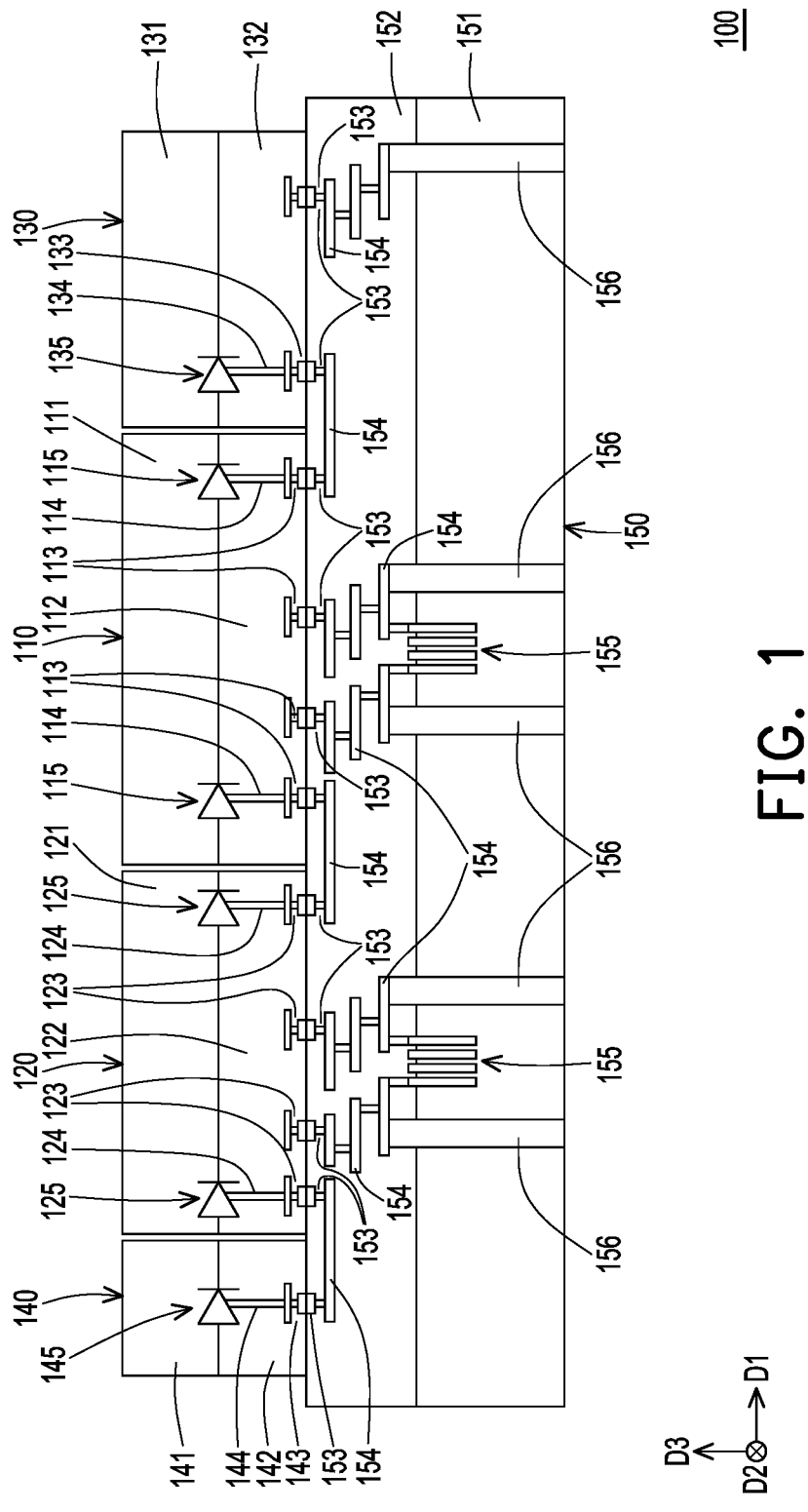
FIG. 1 is a structural side view of a chipset according to an embodiment of the present disclosure.

Reference will now be made in detail to the exemplary embodiments of the present disclosure, examples of which are illustrated in the accompanying drawings. Wherever possible, the same reference numerals are used in the drawings and description to refer to the same or like parts.

FIG. 1 is a structural side view of a chipset according to an embodiment of the present disclosure. Referring to FIG. 1, the logic chip 100 includes logic chips 110 and 120, input/output chips 130 and 140, and an interposer 150. The logic chips 110 and 120, the input/output chips 130 and 140, and the interposer 150 extend along the direction D1 and the direction D2, respectively, and the logic chips 110 and 120, and the input/output chips 130 and 140 are formed on the interposer 150 along the direction D3. The directions D1~D3 are perpendicular to each other. In this embodiment, the logic chips 110 and 120 may be, for example, a system-on-chip (SoC), respectively.

In this embodiment, the logic chip 110 has a substrate layer 111 and a device layer 112, the device layer 112 may be provided with related logic circuits formed therein, but the disclosure is not limited thereto. The substrate layer 111 of the logic chip 110 may be a silicon (Si) substrate, and the material of the device layer 112 may be silicon dioxide ($SiO_2$). The logic chip 110 includes a plurality of bonding components 113 formed on the surface of the device layer 112 (one side away from the substrate layer 111), and the device layer 112 of the logic chip 110 may be formed with a plurality of driving circuits 115 on one side adjacent to the substrate layer 111. The plurality of driving circuits 115 are connected (electrically connected) to at least a portion of the plurality of bonding components 113 through the plurality of metal wirings 114.

In this embodiment, the input/output chip 130 has a substrate layer 131 and a device layer 132, and the device layer 132 may be provided with related input/output circuits formed therein, but the disclosure is not limited thereto. The input/output chip 130 includes a plurality of bonding components 133 formed on the surface of the device layer 132 (one side away from the substrate layer 131), and the device layer 132 of the input/output chip 130 may be formed with a driving circuit 135 on one side adjacent to the substrate layer 131. The driving circuit 135 is connected to the plurality of bonding components 133 through the metal wiring 134.

In this embodiment, the interposer 150 has a substrate layer 151 and a device layer 152. The substrate layer 151 of the interposer 150 may be a silicon (Si) substrate, and the material of the device layer 152 may be silicon dioxide ($SiO_2$). The interposer 150 includes a plurality of bonding components 153 formed on the surface of the device layer 152 (one side away from the substrate layer 151). In this embodiment, the logic chip 110 is directly bonded to the first portion of the plurality of bonding components 153 of the interposer 150 in a pad-to-pad manner through the first portion of the bonding components 113, and the input/output chip 130 is directly bonded to the second portion of the plurality of bonding components 153 of the interposer 150 in a pad-to-pad manner through a plurality of bonding components 133. At least a portion of the first portion of the plurality of bonding components 153 of the interposer 150 is connected to at least a portion of the second portion of the plurality of bonding components 153 through the metal wiring 154. In this manner, the logic chip 110 and the input/output chip 130 may transmit data signals through the bonding component 113, the bonding component 153, the metal wiring 154 and the bonding component 133.

In this embodiment, the logic chip 120 has a substrate layer 121 and a device layer 122, and the device layer 122 may be provided with related logic circuits formed therein, but the disclosure is not limited thereto. The substrate layer 121 of the logic chip 120 may be a silicon (Si) substrate, and the material of the device layer 122 may be silicon dioxide ($SiO_2$). The logic chip 120 includes a plurality of bonding components 123 formed on the surface of the device layer 122 (one side away from the substrate layer 121), and the device layer 122 of the logic chip 120 may be formed with a plurality of driving circuits 125 on one side adjacent to the substrate layer 121. The plurality of driving circuits 125 are connected to the first portion of the plurality of bonding components 123 through the plurality of metal wirings 124. In this embodiment, the logic chip 120 may be directly bonded to the third portion of the plurality of bonding components 153 of the interposer 150 in a pad-to-pad manner through the plurality of bonding components 123, and at least another portion of the first portion of the plurality of bonding components 153 of the interposer 150 is connected to the third portion of the plurality of bonding components 153 through the metal wiring 154. In this way, the logic chip 110 and the logic chip 120 may transmit data signals through the bonding component 113, the bonding component 153, the metal wiring 154, and the bonding component 123.

In this embodiment, the input/output chip 140 has a substrate layer 141 and a device layer 142, the device layer 142 may be provided with related input/output circuits formed therein, but the disclosure is not limited thereto. The input/output chip 140 includes a plurality of bonding components 143 formed on the surface of the device layer 142 (one side away from the substrate layer 141), and the device layer 142 of the input/output chip 140 may be formed with a driving circuit 145 on one side adjacent to the substrate layer 141. The driving circuit 145 is connected to at least a portion of the plurality of bonding components 143 through the metal wiring 144.

In this embodiment, the logic chip 120 is directly bonded to another first portion of the plurality of bonding components 153 of the interposer 150 in a pad-to-pad manner through another first portion of the plurality of bonding components 123, and the input/output chip 140 is directly bonded to another second portion of the plurality of bonding components 153 of the interposer 150 in a pad-to-pad manner through the plurality of bonding components 143. At least a portion of another first portion of the plurality of bonding components 153 of the interposer 150 is connected to another second portion of the bonding component 153 through the metal wiring 154. In this manner, the logic chip 120 may communicate with the input/output chip 140 through the bonding component 123, the bonding component 153, the metal wiring 154, and the bonding component 143, and may transmit data signals.

In this embodiment, the substrate layer 151 of the interposer 150 may include a plurality of deep trench capacitors (DTCs) 155 formed on one side adjacent to the device layer 152. The logic chips 110 and 120 are directly bonded to the fourth portion of the plurality of bonding components 153 in the device layer 152 of the interposer 150 in a pad-to-pad manner through the second portion of the plurality of bonding components 113 and 123 respectively, and the fourth portion of the plurality of bonding components 153 in the device layer 152 of the interposer 150 is connected to the plurality of deep trench capacitors 155 through the metal wiring 154. In this embodiment, the substrate layer 151 of the interposer 150 may include a deep trench capacitor 155 formed on one side adjacent to the device layer 152. The logic chips 110 and 120 may be directly bonded to the fourth portion of the plurality of bonding components 153 in the device layer 152 of the interposer 150 in a pad-to-pad manner through the second portion of the bonding components 113 and 123, and the fourth portion of the plurality of bonding components 153 in the device layer 152 of the interposer 150 is connected to the deep trench capacitor 155 through the metal wiring 154. In this way, the logic chips 110 and 120 may be electrically connected to the deep trench capacitor 155 through the bonding components 113, 123 and 153 and the metal wiring 154 to reduce the IR-drop between the logic chips 110 and 120. In addition, the interposer 150 may further be formed with a plurality of through silicon vias (TSVs) 156 penetrating the substrate layer 151 of the interposer 150 and extending into at least part of the device layer 152 of the interposer 150, and the four portion of the plurality of bonding components 153 in the device layer 152 of the interposer 150 is also connected to the plurality of TSVs 156 through the metal wiring 154. In this way, the logic chips 110 and 120 may be electrically connected to external circuits through bonding components 113, 123 and 153, metal wiring 154 and the plurality of TSVs 156 to transmit power signals and/or data signals. In addition, the input/output chip 130 may also be electrically connected to external circuits through the bonding components 133 and 153, the metal wiring 154 and the plurality of TSVs 156 to transmit power signals and/or data signals.

Therefore, the logic chips 110 and 120 as well as the input/output chips 130 and 140 of the chipset 100 of the present embodiment may be directly bonded to the interposer 150 in a pad-to-pad manner, and electrical connection is performed through the metal wiring in the interposer 150 to transmit power signals and/or data signals. In other words, the logic chips 110 and 120 and the input/output chips 130 and 140 of the chipset 100 of the present disclosure do not need additional connection interface circuits, such as die to die (D2D) interface circuit, high bandwidth memory (HBM) physical interface circuit and the required bump and so on. In this way, the circuit area loss and the consumption caused by the D2D interface circuit of the chipset 100 of this embodiment may be effectively reduced.

In addition, it should be noted that FIG. 1 is illustrated to show the connection relationship in which various chips are electrically connected through an interposer. The location and quantity of the logic chip and the input/output chip of the present disclosure provided on the interposer are not limited to those shown in FIG. 1, and the arrangement position and number of bonding components, driving circuits, metal wirings, deep trench capacitors, and TSVs shown in FIG. 1 are not limited to those shown in FIG. 1.

Figure 2:
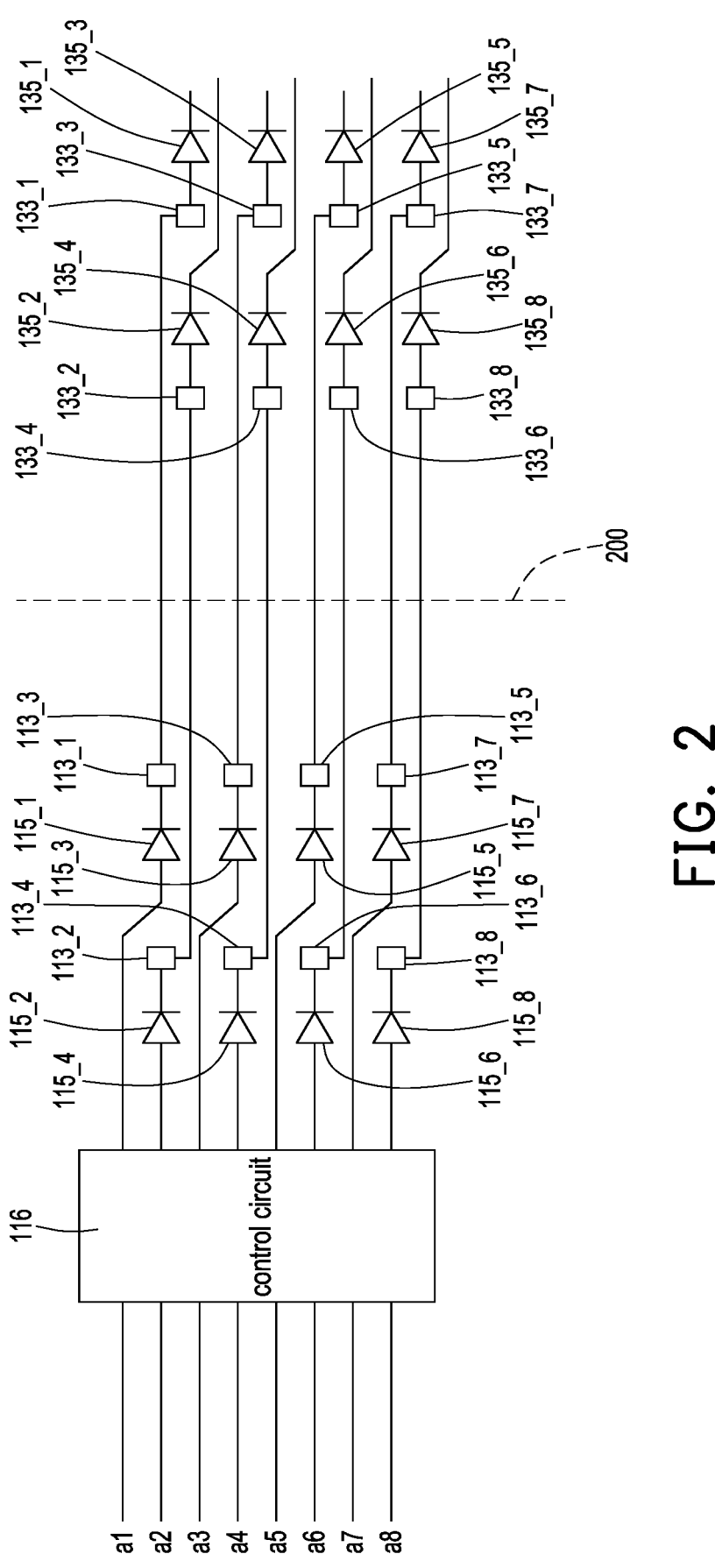
FIG. 2 is an equivalent circuit diagram of a chipset according to an embodiment of the present disclosure.

FIG. 2 is an equivalent circuit diagram of a chipset according to an embodiment of the present disclosure. Referring to FIG. 1 and FIG. 2, an equivalent circuit between the logic chip 110 and the input/output chip 130 is described as an example. An equivalent circuit of the bonding component 153 in which any one of the bonding components 113 shown in FIG. 1 is bonded to a corresponding one of the input/output chips 130 may be as shown in FIG. 2. In this embodiment, the logic chip 110 may include a control circuit 116, a plurality of driving circuits 115_1 to 115_8, and a plurality of bonding pads 115_1 to 115_8. The input/output chip 130 may include a plurality of driving circuits 135_1 to 135_8 and a plurality of bonding pads 135_1 to 135_8. The bonding pads 115_1 to 115_8 and the bonding pads 135_1 to 135_8 may be connected through a plurality of bonding pads and metal wiring of the interposer 150. In this manner, the control circuit 116 may receive, for example, a plurality of data signals a1 to a8 of a plurality of signal lines, and the control circuit 116 may directly provide the data signals a1 to a8 to the driving circuits 115_1 to 115_8 to enhance the signal strength of the data signals, and then transmitted to the bonding pads 135_1 to 135_8 of the input/output chip 130 through the bonding pads 115_1 to 115_8 and the plurality of corresponding bonding pads and metal wirings in the interposer 150. The metal wiring in the interposer 150 may be extended to the other side of the chip edge 200 from one side of the chip edge 200 between the logic chip 110 and the input/output chip 130. The bonding pads 135_1 to 135_8 may transmit the received data signals a1 to a8 to other input/output circuits in the input/output chip 130 after enhancing the signal strength of the data signals through the driving circuits 135_1 to 135_8. In other words, the signal transmission between the logic chip 110 and the input/output chip 130 of the present embodiment does not need to be implemented through an additional connection circuit, especially the use of a multiplexer (Mux) is not required. Therefore, the connection method between other chips may be deduced in the manner described above. The driving circuits 115, 125, 135, and 145 in FIG. 1 may be a multiplexer-free circuit. In addition, since the logic chip 110 and the input/output chip 130 and the interposer 150 are bonded by hybrid bonding, there is no requirement for high electrostatic discharge (ESD) protection, and no additional ESD protection circuit is required.

Figure 3:
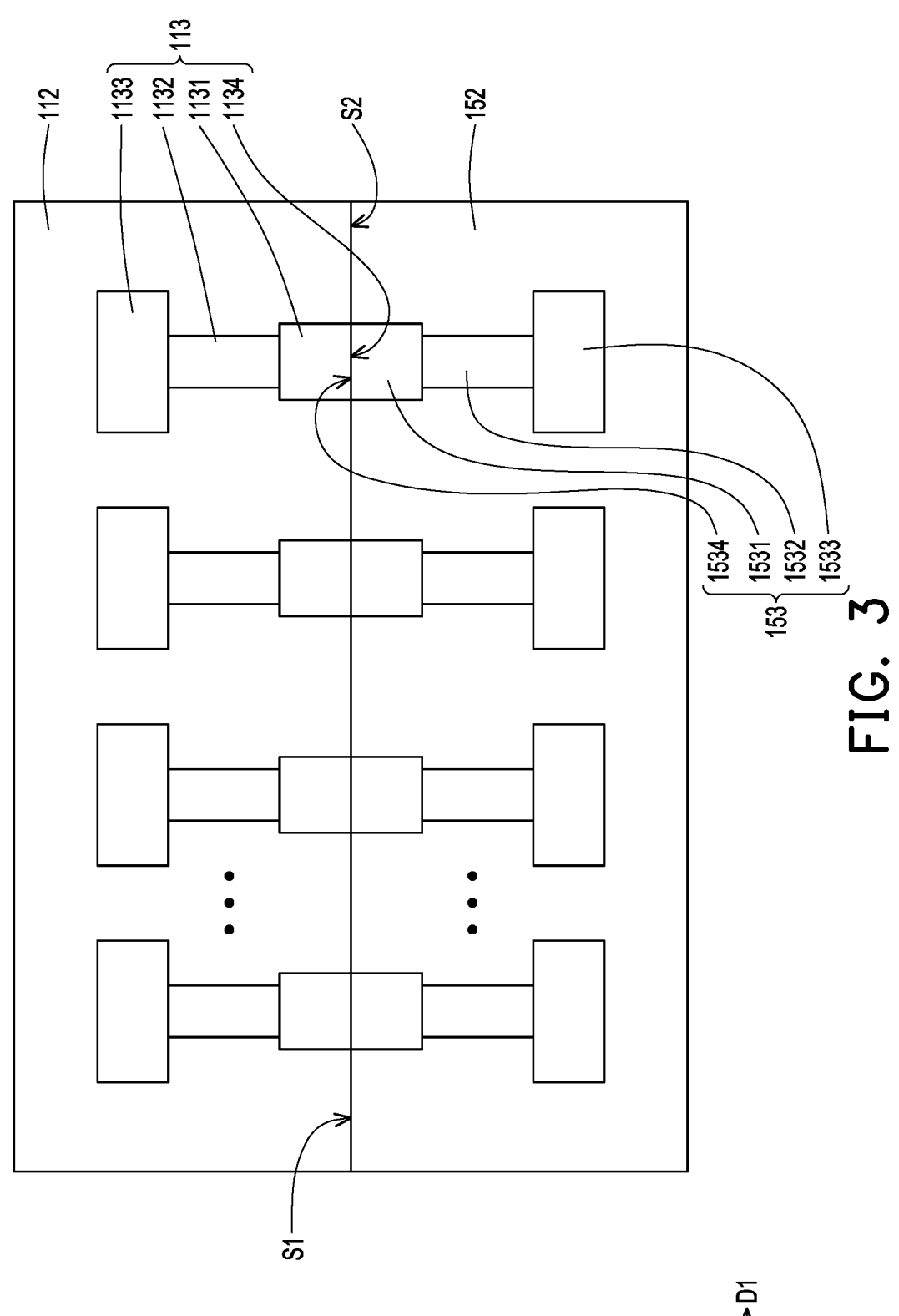
FIG. 3 is a schematic view of a hybrid bonding structure according to an embodiment of the present disclosure.

FIG. 3 is a schematic view of a hybrid bonding structure according to an embodiment of the present disclosure.

Referring to FIG. 1 and FIG. 3, the bonding components 113, 123, 133, 143 of the logic chips 110 and 120 and the input/output chips 130 and 140 as well as the bonding component 153 of the interposer 150 may be bonded by hybrid bonding. Take the bonding method of the bonding component 113 of the logic chip 110 and the bonding component 153 of the interposer 150 as an example. Any one of the bonding components 113 shown in FIG. 1 and its corresponding bonded bonding component 153 may realize multiple bonding components as shown in FIG. 3, but the present disclosure is not limited thereto. Any one of the bonding components 113 shown in FIG. 1 and its corresponding bonded bonding component 153 may be realized by an array of components formed by a plurality of bonding components (e.g., 30×60 bonding components). As shown in FIG. 3, the bonding component 113 is provided in the device layer 112, and the bonding component 153 is provided in the device layer 152. The bonding component 113 and the bonding component 153 may include bonding pads 1131 and 1531, pillars 1132 and 1532, and metal pads 1133 and 1533. The bonding surface 1534 of the bonding component 153 is the same height as the surface S1 of the device layer 152, and the bonding surface 1134 of the bonding component 113 is the same height as the surface S2 of the device layer 112. The bonding surface 1134 of the bonding component 113 is directly bonded to the bonding surface 1534 of the bonding component 153. Materials of the bonding component 113 and the bonding component 153 include, but are not limited to, copper (Cu) or aluminum (Al). Therefore, signals may be transmitted between the logic chip 110 and the interposer 150 through the bonding component 113 and the bonding component 153, and the bonding methods of the bonding components of other chips of the present disclosure and the bonding components of the interposer 150 may be deduced by analogy.

FIG. 4 is a flowchart of a method for manufacturing a chipset according to an embodiment of the present disclosure. Referring to FIG. 4 and FIG. 1, the chipset 100 may be manufactured according to the following steps S410 to S450. In step S410, a plurality of bonding components 113 are formed in the device layer 112 of the logic chip 110. In detail, the metal wiring 114, the driving circuit 115 and related logic circuits may be respectively formed first on the substrate layer 111 of the logic chip 110, and an oxide passivation layer may be formed to cover the metal wiring 114, the driving circuit 115, and related logic circuits to form the device layer 112. Next, a plurality of bonding components 113 may be formed on the surface of one side of the device layer 112 away from the substrate layer 111, and an oxide passivation layer may be formed again to cover the plurality of bonding components 113. The bonding surfaces of the plurality of bonding components 113 are respectively at the same height as the surface of the device layer 112 and exposed.

In step S420, a plurality of bonding components 133 are formed in the device layer 132 of the input/output chip 130. In detail, the metal wiring 134, the driving circuit 135 and related input/output circuits may be respectively formed first on the substrate layer 131 of the input/output chip 130, and an oxide passivation layer may be formed to cover the metal wiring 134, the driving circuit 135, and related logic circuits to form the device layer 132. Next, a plurality of bonding components 133 may be formed on the surface of one side of the device layer 132 away from the substrate layer 131, and an oxide passivation layer may be formed again to cover the plurality of bonding components 133. The bonding surfaces of the plurality of bonding components 133 are respectively at the same height as the surface of the device layer 132 and exposed.

In step S430, a plurality of bonding components 153 are formed in the device layer 152 of the interposer 150, and at least a portion of the first portion of the plurality of bonding components 153 is connected to the second portion of the plurality of bonding components 153 through the metal wiring 154. In this embodiment, the interposer 150 may be a silicon interposer, so the substrate layer 151 may be a silicon substrate. In detail, a plurality of TSVs 156 may be formed in the substrate layer 151 of the interposer 150 first to pass through the substrate layer 151 of the interposer 150, and the substrate layer 151 of the interposer 150 may include a plurality of deep trench capacitors 155 formed on one side adjacent to the device layer 152. Next, the metal wiring 154 may be formed to connect the multiple deep trench capacitors 155 and multiple TSVs 156, and an oxide passivation layer may be formed to cover the metal wiring 154, multiple deep trench capacitors 155, and the multiple TSVs 156 to form the device layer 152. Next, a plurality of bonding components 153 may be formed on the surface of one side of the device layer 152 away from the substrate layer 151, and an oxide passivation layer may be formed again to cover the plurality of bonding components 153. The bonding surfaces of the plurality of bonding components 153 are at the same height as the surface of the device layer 152 and exposed.

In step S440, the first portion of the plurality of bonding components 113 of the logic chip 110 is directly bonded to the first portion of the plurality of bonding components 153 of the interposer 150 in a pad-to-pad manner. In step S450, the plurality of bonding components 133 of the input/output chip 130 are directly bonded to the second portion of the plurality of bonding components 153 of the interposer 150 in a pad-to-pad manner.

In the manner described above, the formation of the logic chip 120 and the input/output chip 140 may be deduced by analogy. In addition, based on the aforementioned manufacturing process, the chipset 100 of this embodiment does not need to form an additional structure of connection circuits or connection interfaces, so the manufacturing method of this embodiment may effectively manufacture chipsets 100 with smaller chip area or higher chip density.

Figure 5A:
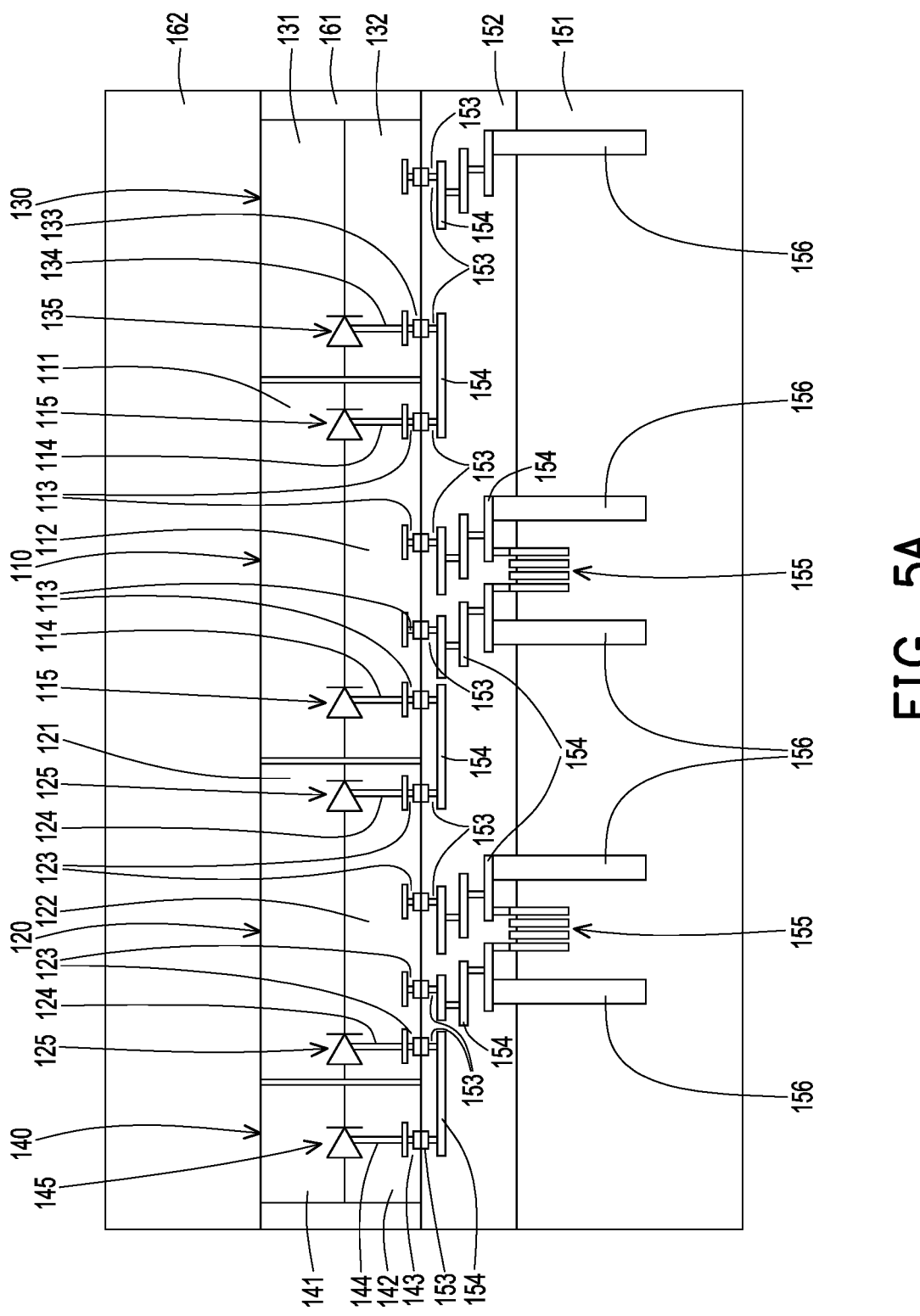
FIG. 5A to FIG. 5I are schematic views of a manufacturing process of a chipset according to an embodiment of the present disclosure.
Figure 5B:
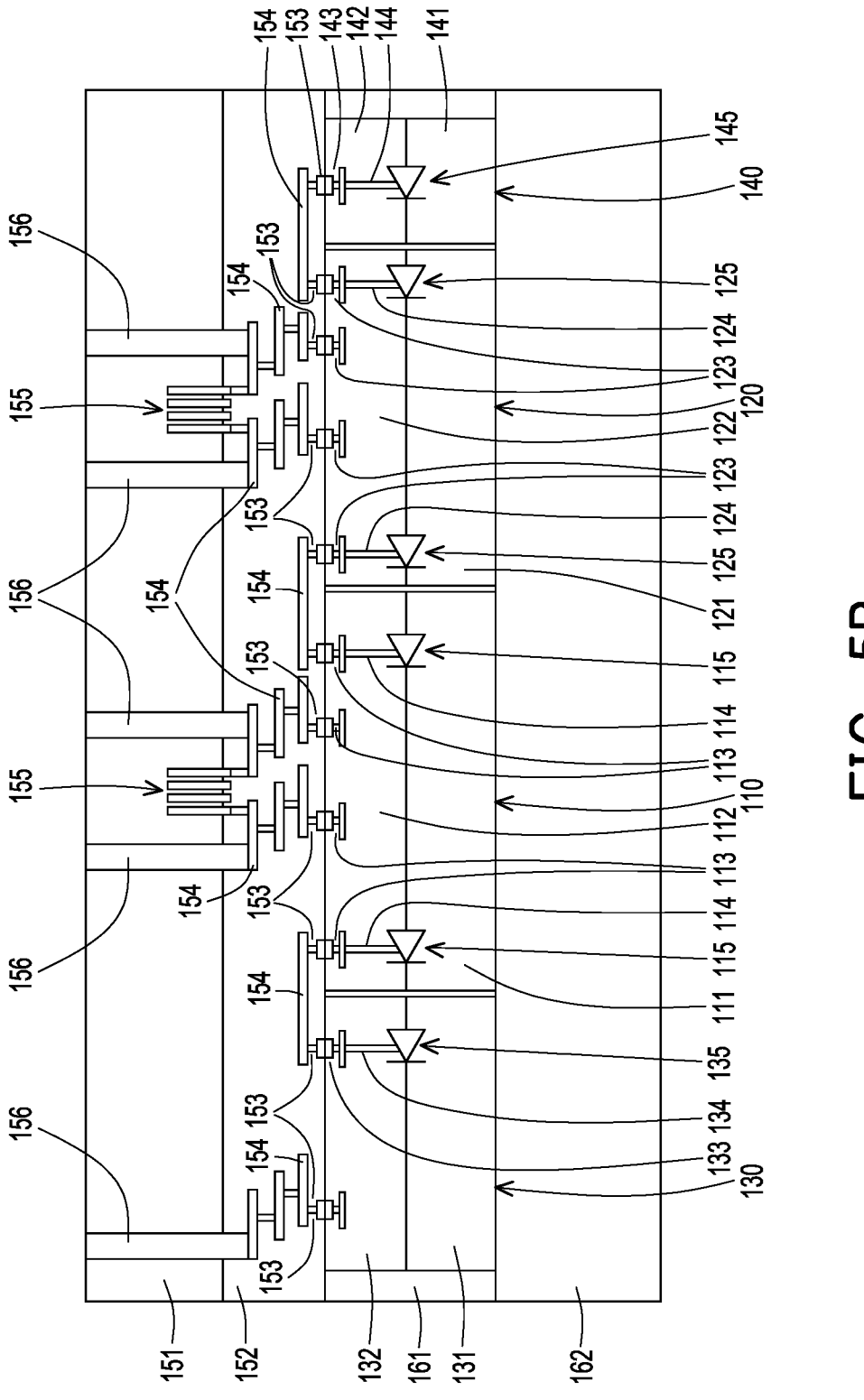
Figure 5C:
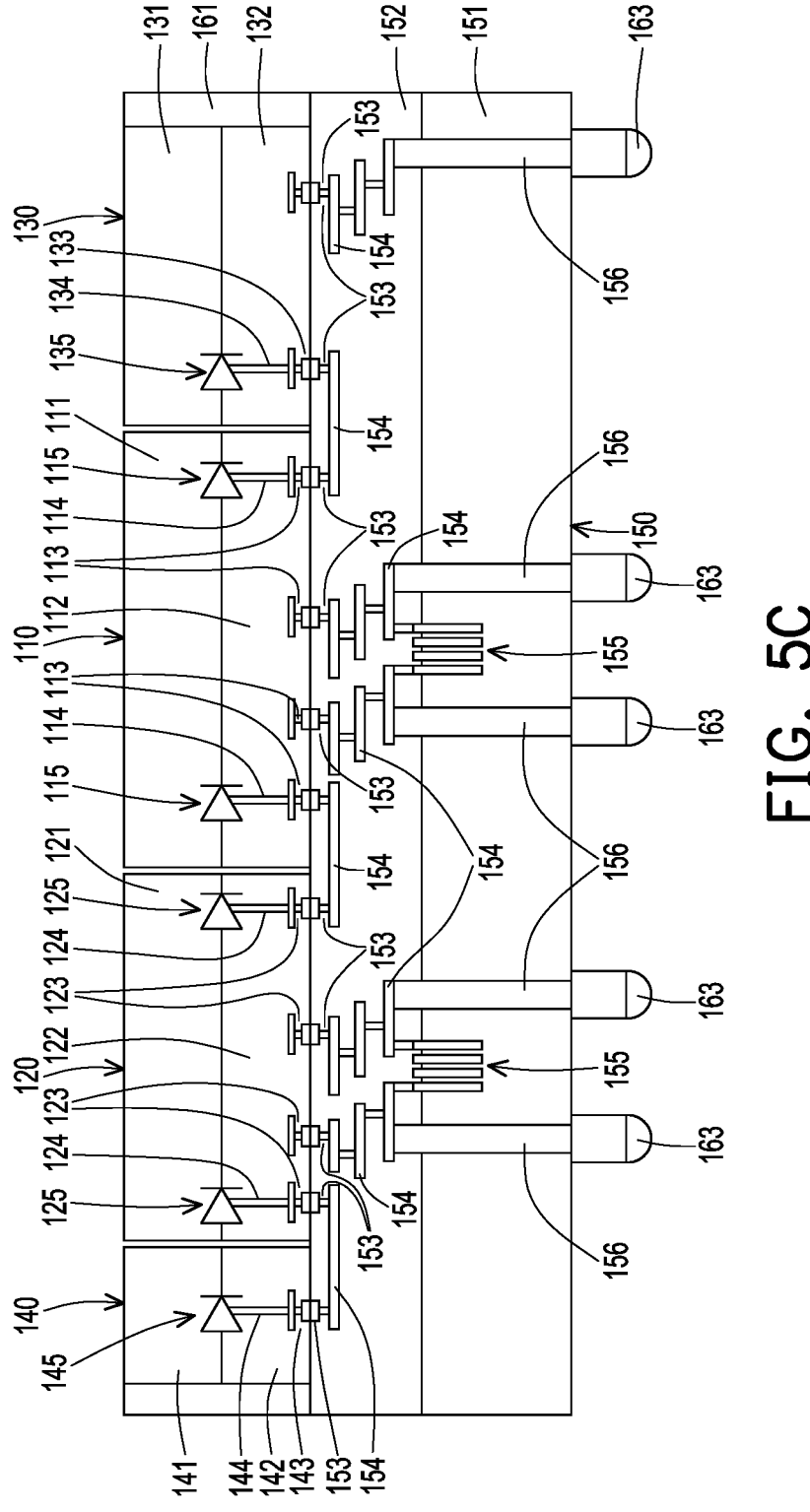
Figure 5D:
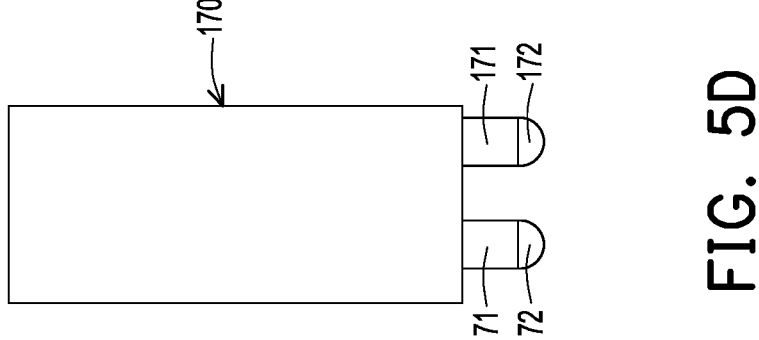
Figure 5E:
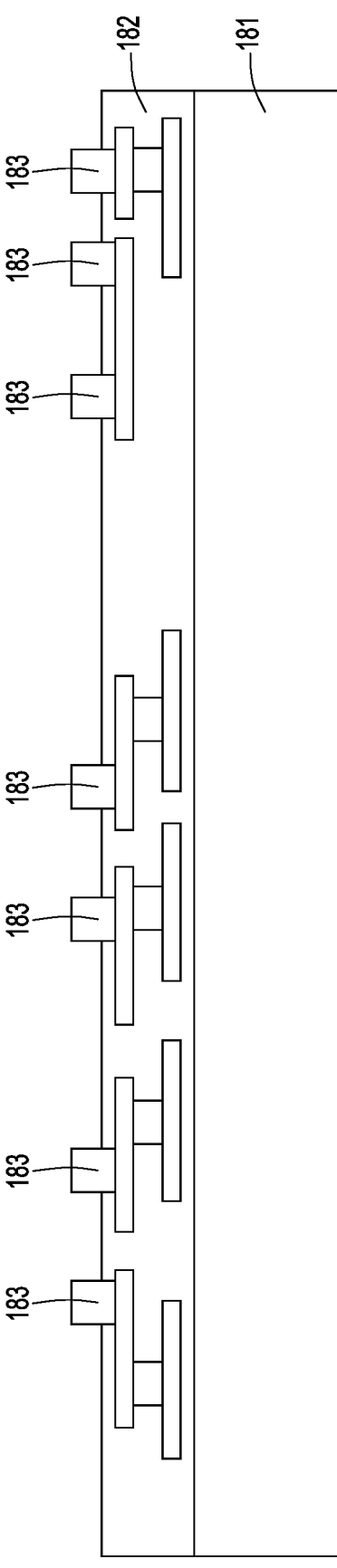
Figure 5F:
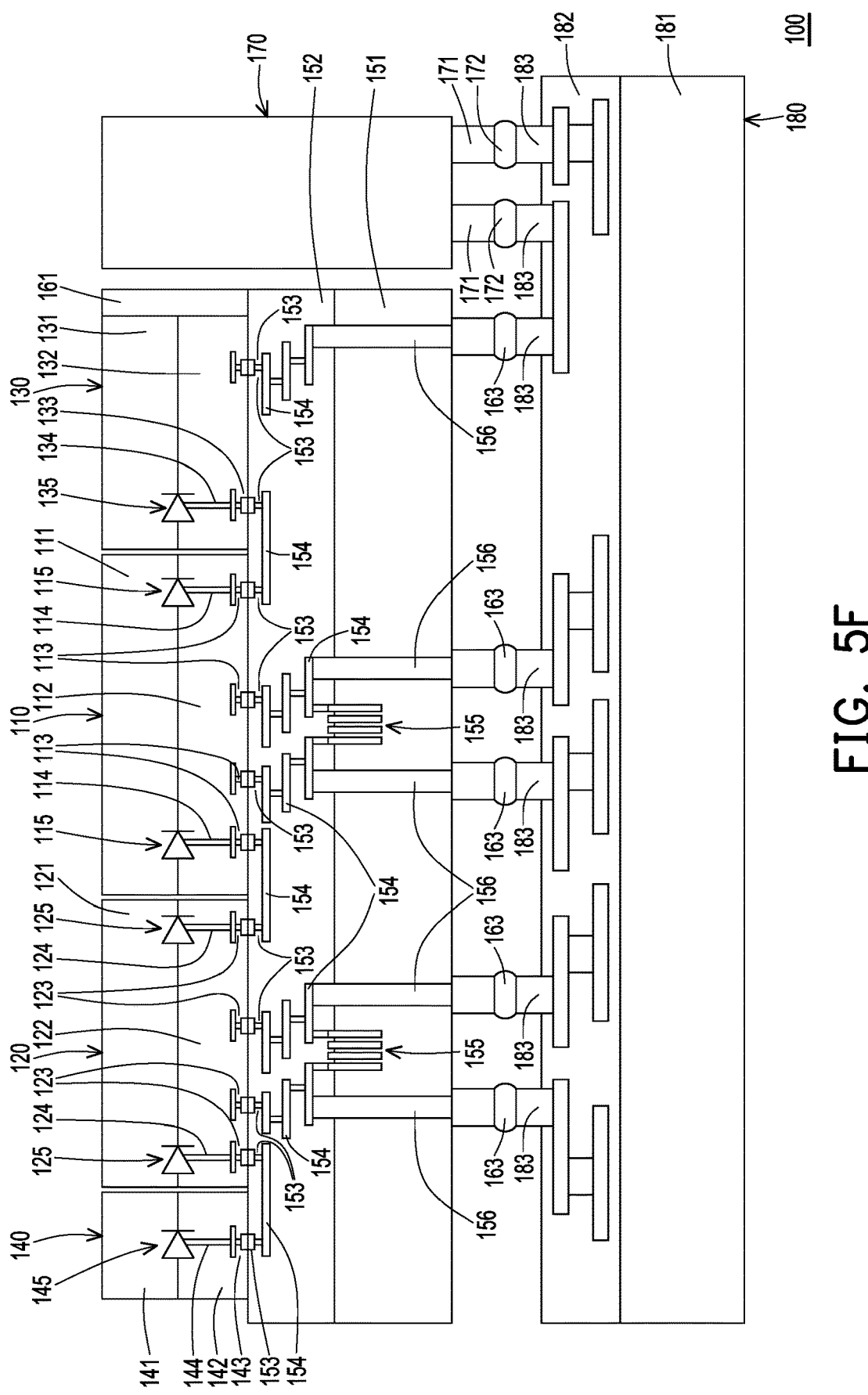
Figure 5G:
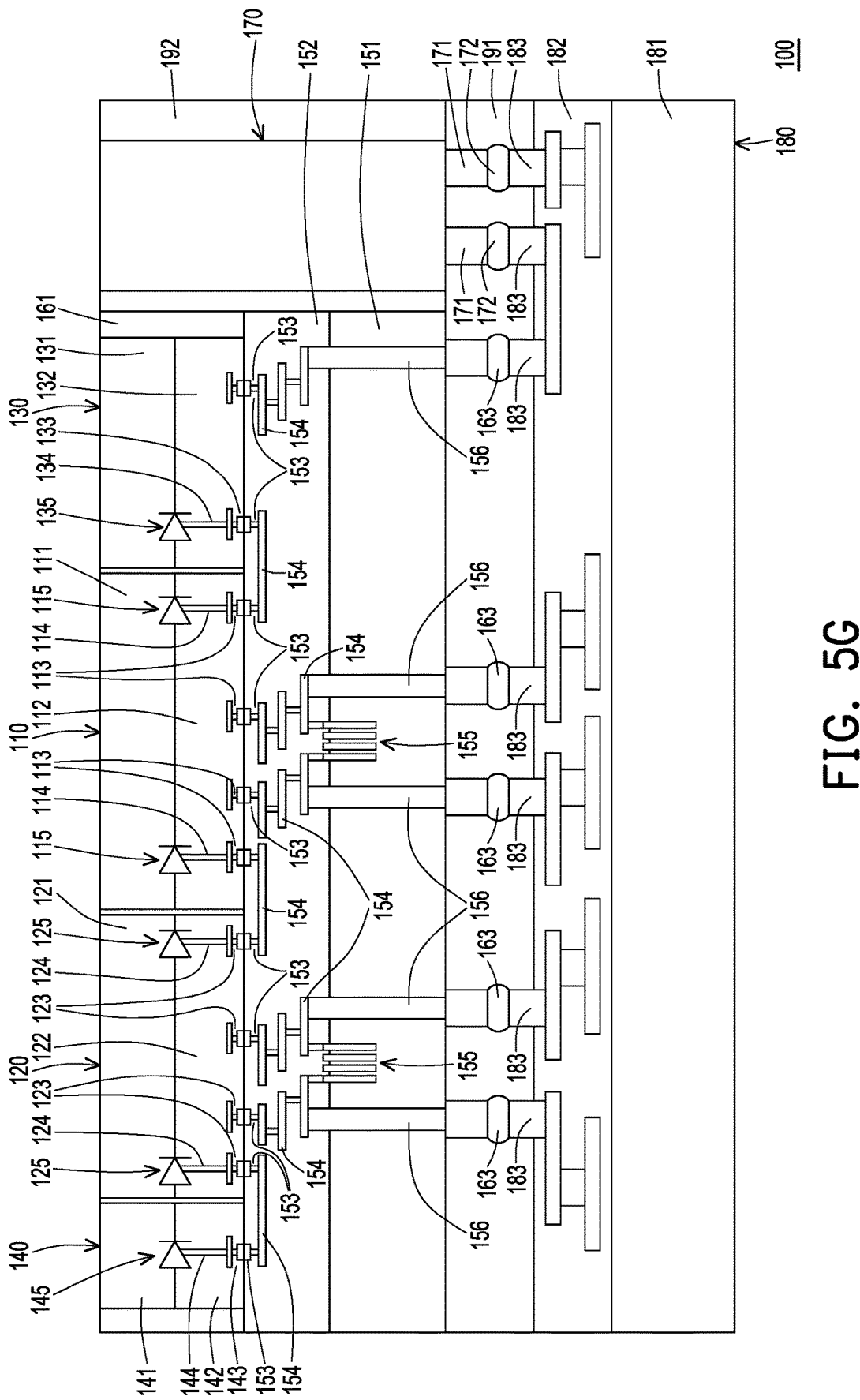
Figure 5H:
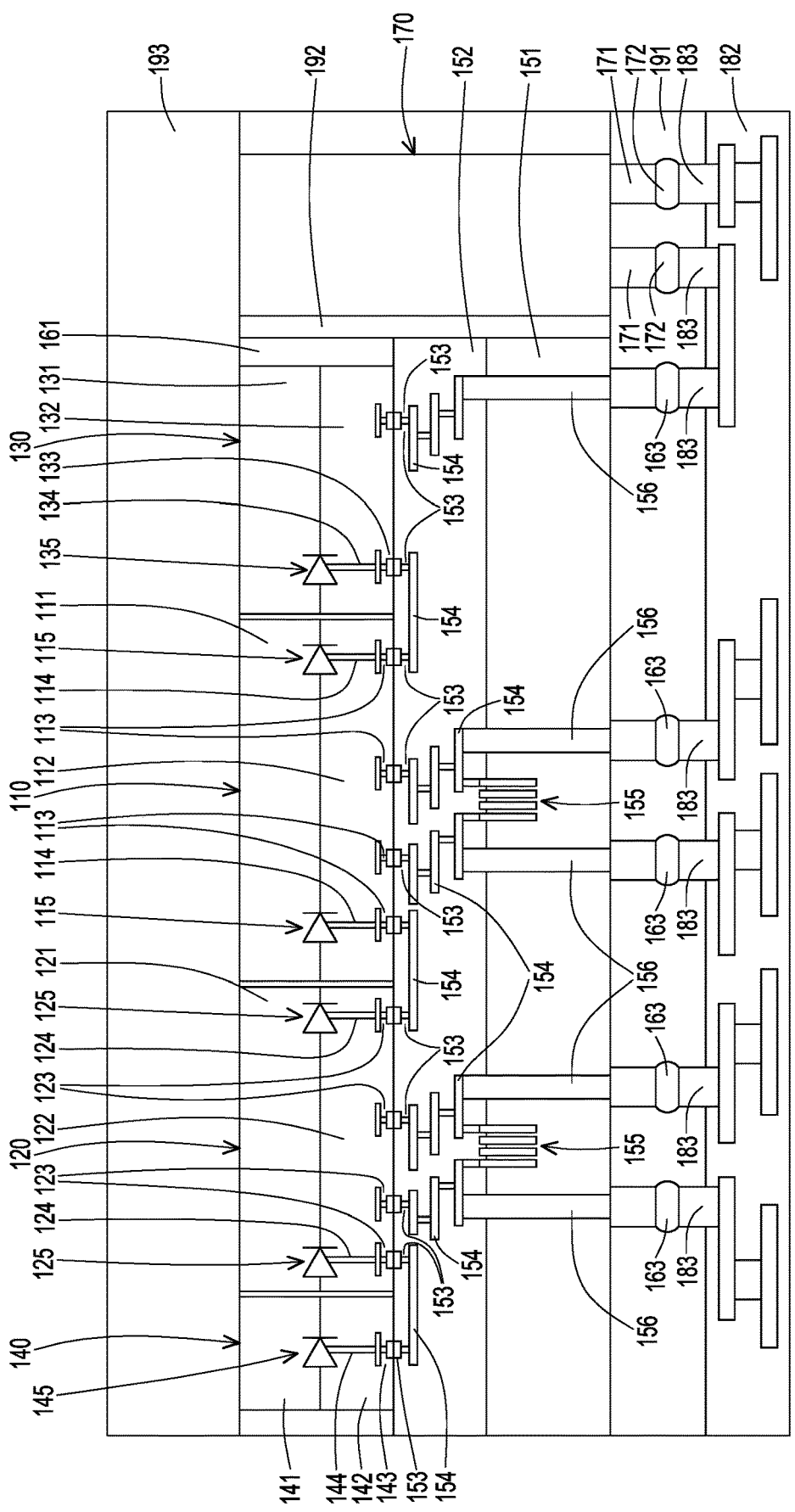
Figure 5I:
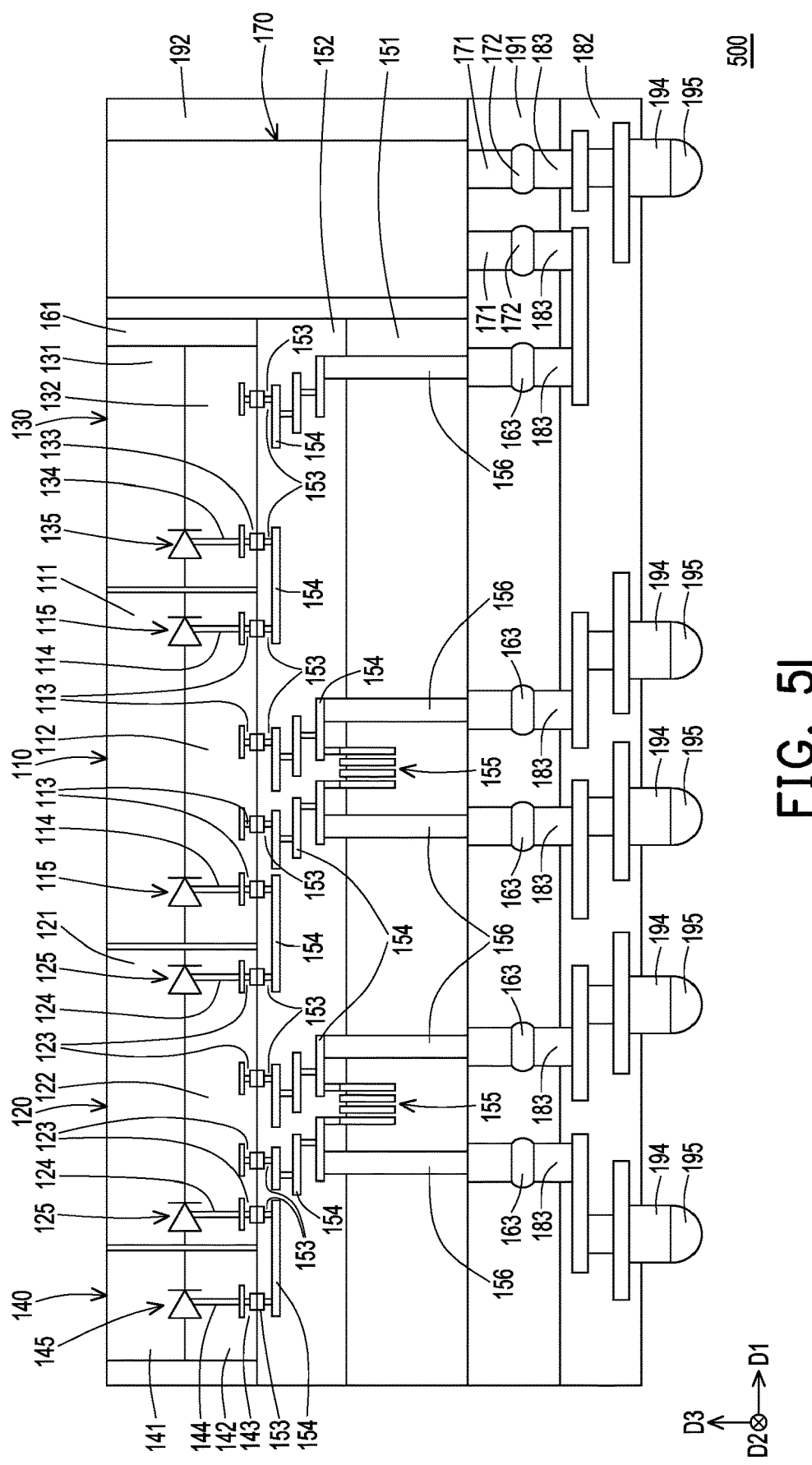

FIG. 5A to FIG. 5I are schematic views of a manufacturing process of a chipset according to an embodiment of the present disclosure. Referring to FIG. 1 and FIG. 5A to FIG. 5I, this embodiment may perform a further manufacturing process for the chipset 100 of the above-mentioned embodiment of FIG. 1 to be integrated with a memory chip. As shown in FIG. 5A, an organic passivation layer 161 may be formed between the logic chips 110 and 120 and the input/output chips 130 and 140 of the chipset 100 of FIG. 1, and a temporary carrier 162 may be formed on the logic chips 110 and 120 and the surface of one side of the substrate layers 111, 121, 131 and 141 of the input/output chips 130 and 140. Next, as shown in FIG. 5B, the chipset may be turned over, and the substrate layer 151 of the interposer 150 may be cut, so that the plurality of TSVs 156 in the substrate layer 151 of the interposer 150 may be exposed. Next, as shown in FIG. 5C, a plurality of bumps 163 may be formed to connect the plurality of TSVs 156, and the chipset is turned over after removing the temporary carrier 162. Next, as shown in FIG. 5D, a memory chip 170 may be formed, and the memory chip 170 includes a plurality of exposed metal wirings 171 and a plurality of bumps 172. Next, as shown in FIG. 5E, a redistribution layer 182 may be formed on the temporary carrier 181, and the redistribution layer 182 includes a plurality of metal wirings 183 and is exposed on the surface of the redistribution layer 182. Next, as shown in FIG. 5F, the metal wirings 183 of the redistribution layer 182 may be connected to the plurality of TSVs 156 of the interposer 150 through the plurality of bumps 163, and may be connected with a plurality of metal wirings 171 of the memory chip 170 through the plurality of bumps 172 of the memory chip 170. Therefore, the chipset 100 and the memory chip 170 may transmit data signals through the redistribution layer 182, and the chipset 100 may further be electrically connected to other external functional circuits through the redistribution layer 182. Next, as shown in FIG. 5G, an underfill material 191 may be filled between the chipset 100, the memory chip 170 and the redistribution layer 182, and a molding material 192 may be filled between the chipset 100 and the memory chip 170. In detail, the molding material 192 may be filled between the logic chip 110 and the logic chip 120, between the logic chip 110 and the input/output chip 130, between the logic chip 120 and the input/output chip 140, and between the input/output chip 130 and the memory chip 170, and the molding material 192 is an organic material. Next, as shown in FIG. 5H, the temporary carrier 181 may be removed, and a temporary carrier 193 is formed on the substrate layers 111, 121, 131, and 141 of the logic chips 110 and 120 as well as the input/output chips 130 and 140 and the surface of one side of the memory chip 170. Next, as shown in FIG. 5I, copper pillars 194 and bumps 195 may be formed on the surface of one side of the redistribution layer 182, so that the plurality of metal wirings 183 of the redistribution layer 182 may be electrically connected with other external functional circuits through the copper pillars 194 and the bumps 195. Finally, the temporary carrier 193 may be removed to complete the manufacturing process of the chipset 500. Therefore, the chipset 100 of the embodiment of FIG. 1 may be integrated with the memory chip 170 to form the chipset 500.

Figure 6:
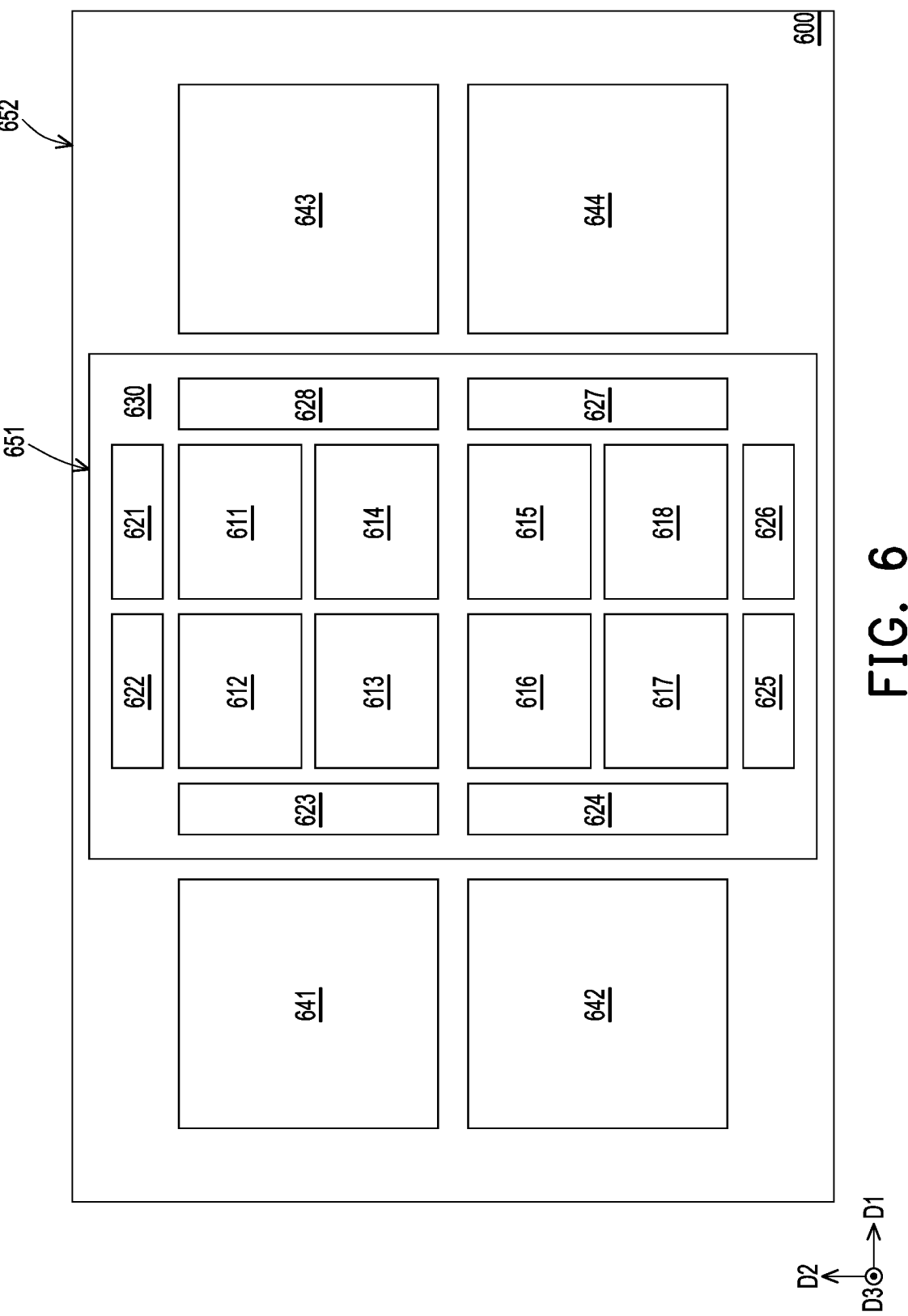
FIG. 6 is a top plan view of a chipset according to an embodiment of the present disclosure.

FIG. 6 is a top plan view of a chipset according to an embodiment of the present disclosure. Referring to FIG. 6, this embodiment is an example of a top-view structure of a chipset of the present disclosure. The chipset 600 of FIG. 6 includes a chipset 630 formed on a redistribution layer 652 (like the redistribution layer 182 described above) and a plurality of memory chips 641 to 644. The integration method of the chipset 630 and the plurality of memory chips 641 to 644 can be as described in the above-mentioned embodiments of FIG. 5A to FIG. 5I. In this embodiment, the chipset 630 may include multiple logic chips 611 to 618 and multiple input/output chips 621 to 628. The multiple logic chips 611 to 618 and the multiple input/output chips 621 to 628 may be formed on the interposer 651 (like the interposer 150 described above). The logic chips 611 to 618 are located at the center of the chipset 600, and the input/output chips 621 to 628 are arranged around the outside of the logic chips 611 to 618. The memory chips 641 to 644 are located outside the input/output chips 621 to 628. In this manner, since the connection methods and communication methods among the plurality of logic chips 611 to 618 and the plurality of input/output chips 621 to 628 may be as described in the above-mentioned embodiments of FIG. 1 to FIG. 3, there is no need to form additional related connection interface circuits between the logic chip and the input/output chip on the interposer 651 to allow communication between the logic chip and the input/output chip. Therefore, the chipset 630 may have the advantages of smaller chip area or higher chip density.

To sum up, in the chipset and the manufacturing method thereof of the present disclosure, the logic chip and the input/output chip may be directly bonded to the interposer in the manner of pad to pad, and the signal transmission path may be formed through the metal wiring in the interposer to reduce the space for setting up other connection interface circuits. In particular, the disclosure may be applied to the chipset used in artificial intelligence chips or the chipset with multiple logic cores and high-density memory set up to meet high-performance computing requirements. The chipset design of the present disclosure may effectively reduce power consumption and decrease chip area.

Finally, it should be noted that the above embodiments are only used to illustrate the technical solutions of the present disclosure, but not to limit them. Although the present disclosure has been described in detail with reference to the foregoing embodiments, those of ordinary skill in the art should understand that: the technical solutions described in the foregoing embodiments can still be modified, or some or all of the technical features thereof can be equivalently replaced; and these modifications or replacements do not make the essence of the corresponding technical solutions deviate from the scope of the technical solutions of the embodiments of the present disclosure.

What is claimed is:

1. A chipset, comprising:

a logic chip, having a first device layer and a first substrate layer, and comprising a plurality of first bonding components disposed in the first device layer;

an input/output chip, having a second device layer and a second substrate layer, and comprising a plurality of second bonding components disposed in the second device layer; and an interposer, having a third device layer and a third substrate layer, and comprising a plurality of third bonding components disposed in the third device layer, wherein the logic chip is directly bonded to a first portion of the plurality of third bonding components of the interposer in a pad-to-pad manner through a first portion of the plurality of first bonding components, and the input/output chip is directly bonded to a second portion of the plurality of third bonding components of the interposer in the pad-to-pad manner through the plurality of second bonding components, wherein at least a portion of the first portion of the plurality of third bonding components is connected to at least a portion of the second portion of the plurality of third bonding components through a first metal wiring in the interposer, wherein the third substrate layer of the interposer comprises a deep trench capacitor on one side adjacent to the third device layer, and the logic chip is directly bonded to a third portion of the plurality of third bonding components in the third device layer in the pad-to-pad manner through a second portion of the plurality of first bonding components, and the third portion of the plurality of third bonding components in the third device layer of the interposer is connected to the deep trench capacitor through a third metal wiring.

2. The chipset according to claim 1, wherein the logic chip is bonded to the first portion of the plurality of third bonding components of the interposer in a hybrid bonding manner through the first portion of the plurality of first bonding components, and the input/output chip is bonded to the second portion of the plurality of third bonding components of the interposer in the hybrid bonding manner through the plurality of second bonding components, wherein the plurality of first bonding components, the plurality of second bonding components and the plurality of third bonding components respectively comprise: a bonding pad, having a bonding surface;

a pillar, having one end connected to the bonding pad; and a metal pad, connected with the other end of the pillar.

3. The chipset according to claim 1, further comprising:

another logic chip, having a fourth device layer and a fourth substrate layer, and comprising a plurality of fourth bonding components disposed in the fourth device layer, wherein the another logic chip is directly bonded to a fourth portion of the plurality of third bonding components of the interposer in the pad-to-pad manner through the plurality of fourth bonding components, and at least another portion of the first portion of the plurality of third bonding components is connected to at least a portion of the fourth portion of the plurality of third bonding components through a second metal wiring.

4. The chipset according to claim 3, wherein the interposer comprises a plurality of through silicon vias (TSVs) penetrating the third substrate layer of the interposer and extending into at least a portion of the third device layer of the interposer, and the third portion of the plurality of third bonding components in the third device layer of the interposer is connected to the plurality of TSVs through a third metal wiring.

5. The chipset according to claim 4, further comprising:

a redistribution layer, wherein the redistribution layer is connected with the plurality of TSVs of the interposer through a plurality of bumps.

6. The chipset according to claim 5, further comprising:

a memory chip, connected to the redistribution layer through another plurality of bumps.

7. The chipset according to claim 6, further comprising:

a molding, filled between the logic chip and the another logic chip, between the logic chip and the input/output chip, and between the input/output chip and the memory chip, wherein the molding is an organic material.

8. The chipset according to claim 6, wherein the logic chip and the another logic chip are located at the center of the chipset, the input/output chip is arranged around the outside of the logic chip and the another logic chip, and the memory chip is located at the outside of the input/output chip.

9. The chipset according to claim 3, wherein the logic chip and the input/output chip transmit data signals through the first metal wiring, and the logic chip and the another logic chip transmit the data signals through the second metal wiring.

10. The chipset according to claim 1, wherein the first device layer of the logic chip comprises a first driving circuit on one side adjacent to the first substrate layer, and the first driving circuit is connected to the first portion of the plurality of first bonding components through a fourth metal wiring.

11. The chipset according to claim 10, wherein the second device layer of the input/output chip comprises a second driving circuit on one side adjacent to the second substrate layer, and the second driving circuit is connected to at least a portion of the plurality of second bonding components through a fifth metal wiring.

12. The chipset according to claim 11, wherein the first driving circuit and the second driving circuit are respectively multiplexer-free circuits.

* * * * *